(12) United States Patent
Gold et al.

(10) Patent No.: US 7,846,497 B2
(45) Date of Patent: Dec. 7, 2010

(54) METHOD AND APPARATUS FOR CONTROLLING GAS FLOW TO A PROCESSING CHAMBER

(75) Inventors: Ezra Robert Gold, Sunnyvale, CA (US); Richard Charles Fovell, San Jose, CA (US); James Patrick Cruse, Capitola, CA (US); Jared Ahmad Lee, Santa Clara, CA (US); Bruno Geoffrion, Sunnyvale, CA (US); Douglas Arthur Buchberger, Livermore, CA (US); Martin J. Salinas, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 947 days.

(21) Appl. No.: 11/678,623

(22) Filed: Feb. 26, 2007

(65) Prior Publication Data

US 2008/0202588 A1 Aug. 28, 2008

(51) Int. Cl.
*C23C 16/00* (2006.01)
*F17D 1/00* (2006.01)
*F17D 1/02* (2006.01)
(52) U.S. Cl. .................. 427/248.1; 137/597; 137/1
(58) Field of Classification Search .............. 427/248.1; 118/715; 137/597, 1
See application file for complete search history.

(56) References Cited

U.S. PATENT DOCUMENTS

| 4,046,158 | A | 9/1977 | Hayashi et al. |
| 4,590,790 | A | 5/1986 | Hicks et al. |
| 4,687,020 | A | 8/1987 | Doyle |
| 4,761,269 | A | 8/1988 | Conger et al. |
| 4,911,101 | A | 3/1990 | Ballingal, III et al. |
| 5,062,446 | A | 11/1991 | Anderson |
| 5,091,207 | A | 2/1992 | Tanaka |
| 5,129,418 | A | 7/1992 | Shimomura et al. |

(Continued)

FOREIGN PATENT DOCUMENTS

JP  2000-323464  11/2000

(Continued)

OTHER PUBLICATIONS

Search Report in Singapore Patent Application No. 200801438-3 dated Jul. 9, 2008, 6 pages.

(Continued)

*Primary Examiner*—David Turocy
(74) *Attorney, Agent, or Firm*—Patterson & Sheridan, LLP

(57) ABSTRACT

A method and apparatus for delivering gases to a semiconductor processing system are provided. In one embodiment, an apparatus for delivering gases to a semiconductor processing system includes a plurality of gas input and output lines having inlet and outlet ports. Connecting lines couple respective pairs of the gas input and gas output lines. Connecting valves are arranged to control flow through the respective connecting lines. Mass gas flow controllers are arranged to control flow into respective inlet ports. In another embodiment, a method includes providing a manifold having at least a plurality of inlet that may be selectively coupled to at least one of a plurality of outlets, flowing one or more gases through the manifold to a vacuum environment by-passing the processing chamber prior to processing or to a calibration circuit, and flowing the one or more gases into the processing chamber during substrate processing.

21 Claims, 6 Drawing Sheets

U.S. PATENT DOCUMENTS

| | | | |
|---|---|---|---|
| 5,141,021 A | 8/1992 | Shimomura et al. | |
| 5,190,068 A | 3/1993 | Philbin | |
| 5,254,210 A | 10/1993 | Jones et al. | |
| 5,293,778 A | 3/1994 | Schneiter | |
| 5,303,731 A | 4/1994 | Vavra et al. | |
| 5,524,084 A | 6/1996 | Wang et al. | |
| 5,589,110 A | 12/1996 | Motoda et al. | |
| 5,653,807 A | 8/1997 | Crumbaker | |
| 5,662,143 A | 9/1997 | Caughran | |
| 5,865,205 A * | 2/1999 | Wilmer | 137/2 |
| 5,911,238 A | 6/1999 | Bump et al. | |
| 5,925,829 A | 7/1999 | Laragione et al. | |
| 5,944,048 A | 8/1999 | Bump et al. | |
| 5,966,499 A | 10/1999 | Hinkle et al. | |
| 5,996,420 A | 12/1999 | Lee | |
| 6,119,710 A | 9/2000 | Brown | |
| 6,133,148 A * | 10/2000 | Won et al. | 438/680 |
| 6,138,708 A | 10/2000 | Waldbusser | |
| 6,216,726 B1 | 4/2001 | Brown et al. | |
| 6,269,692 B1 | 8/2001 | Drexel et al. | |
| 6,333,272 B1 | 12/2001 | McMillin et al. | |
| 6,343,617 B1 | 2/2002 | Tinsley et al. | |
| 6,352,945 B1 | 3/2002 | Matsuki et al. | |
| 6,532,796 B1 | 3/2003 | Ikeda | |
| 6,579,372 B2 | 6/2003 | Park et al. | |
| 6,640,822 B2 | 11/2003 | Tinsley et al. | |
| 6,681,787 B2 | 1/2004 | Tinsley et al. | |
| 6,712,084 B2 | 3/2004 | Shajll et al. | |
| 6,733,590 B1 | 5/2004 | McLeod et al. | |
| 6,752,166 B2 * | 6/2004 | Lull et al. | 137/9 |
| 6,772,781 B2 * | 8/2004 | Doty et al. | 137/9 |
| 6,773,749 B1 | 8/2004 | Moore | |
| 6,799,603 B1 * | 10/2004 | Moore | 137/597 |
| 6,821,347 B2 | 11/2004 | Carpenter et al. | |
| 7,174,263 B2 * | 2/2007 | Shajii et al. | 702/100 |
| 2002/0046612 A1 | 4/2002 | Mudd | |
| 2002/0076490 A1 | 6/2002 | Chiang et al. | |
| 2002/0083984 A1 | 7/2002 | Easton | |
| 2002/0114732 A1 | 8/2002 | Vyers | |
| 2002/0117202 A1 | 8/2002 | Tinsley et al. | |
| 2002/0117212 A1 | 8/2002 | Vyers et al. | |
| 2002/0139418 A1 | 10/2002 | Tinsley et al. | |
| 2002/0179149 A1 | 12/2002 | Ohmi et al. | |
| 2002/0198668 A1 | 12/2002 | Lull et al. | |
| 2003/0070620 A1 * | 4/2003 | Cooperberg et al. | 118/723 AN |
| 2003/0234039 A1 | 12/2003 | Shajii et al. | |
| 2003/0234048 A1 | 12/2003 | Shajll et al. | |
| 2003/0236592 A1 | 12/2003 | Shaijii et al. | |
| 2003/0236638 A1 | 12/2003 | Shaijii et al. | |
| 2003/0236643 A1 | 12/2003 | Shaijii et al. | |
| 2004/0040664 A1 | 3/2004 | Yang et al. | |
| 2004/0050326 A1 | 3/2004 | Thilderkvist et al. | |
| 2004/0074311 A1 | 4/2004 | Lull et al. | |
| 2004/0083807 A1 | 5/2004 | Mudd et al. | |
| 2004/0112538 A1 | 6/2004 | Larson et al. | |
| 2004/0128021 A1 | 7/2004 | Klekotka | |
| 2004/0163590 A1 | 8/2004 | Tran et al. | |
| 2005/0120805 A1 | 6/2005 | Lane et al. | |
| 2005/0199342 A1 | 9/2005 | Shajii et al. | |
| 2005/0241763 A1 * | 11/2005 | Huang et al. | 156/345.33 |
| 2006/0011237 A1 * | 1/2006 | Tison et al. | 137/487.5 |
| 2006/0068098 A1 | 3/2006 | Yamasaki et al. | |
| 2006/0124169 A1 | 6/2006 | Mizusawa et al. | |
| 2006/0243060 A1 | 11/2006 | Lane et al. | |

FOREIGN PATENT DOCUMENTS

| | | |
|---|---|---|
| WO | WO 02/08487 A | 1/2002 |
| WO | WO-02/08487 A1 | 1/2002 |
| WO | WO 03/089682 A1 | 10/2003 |
| WO | WO 2007/008509 A2 | 1/2007 |

OTHER PUBLICATIONS

Australian Patent Office Search Report for SG200801427-6, Jul. 7, 2008, consists of 4 pages.

Australian Patent Office Search Report for SG200801437-5, Jul. 7, 2008, consists of 4 pages.

EP Search Report for EP08151406, Jul. 21, 2008, consists of 6 pages.

Extended Search Report for EP08151408, Jul. 28, 2008, consists of 7 pages.

Office Action for Korean Patent Application No. 10-2008-0016710 dated Sep. 29, 2009.

Official Letter dated Nov. 12, 2009 from Korean Patent Office for corresponding Korean Patent application 10-2008-0016714. A concise statement of relevance is provided.

Official Letter dated Nov. 12, 2009 from Korean Patent Office for corresponding Korean Patent application 10-2008-0016716. A concise statement of relevance is provided.

Office Action dated Jun. 19, 2009, from the United States Patent and Trademark Office for corresponding U.S. Appl. No. 11/678,622.

Response to Office Action dated Jun. 19, 2009, from the United States Patent and Trademark Office for corresponding U.S. Appl. No. 11/658,622.

Prosecution history of U.S. Appl. No. 11/678,621 as of Feb. 19, 2010.

Prosecution history of U.S. Appl. No. 11/678,622 as of Feb. 19, 2010.

Notice of Allowance for U.S. Appl. No. 11/678,622 dated Apr. 2, 2010.

* cited by examiner

METHOD AND APPARATUS FOR CONTROLLING GAS FLOW TO A PROCESSING CHAMBER

CROSS-REFERENCE TO RELATED APPLICATIONS

This application is related to U.S. patent application Ser. No. 11/678,621, filed Feb. 26, 2007 by Gold, et al. and U.S. patent application Ser. No. 11/678,622, filed Feb. 26, 2007 by Gold, et al. both of which are incorporated by reference in their entireties.

BACKGROUND

1. Field of the Invention

Embodiments of the present invention generally relate to a method and apparatus for controlling gas flow to a processing chamber.

2. Description of the Related Art

Accurate control of gas flows is an important process control attribute critical to many microelectronic device fabrication processes. Providing gas between a substrate and a substrate support in a semiconductor processing chamber is a well-known method for improving heat transfer between the substrate and the substrate support, thereby enhancing the precision of substrate temperature control and uniformity. Additionally, precise control of process gas flows into the processing chamber are required in order to obtain desired processing results, particularly as critical dimensions and film thicknesses shrink. Furthermore, gases may be added to processing chamber effluent streams to mitigate the environmental impact of substrate processing. Good control of the gases added to the effluent stream is necessary to ensure both cost effective and proper remediation.

Conventional gas delivery systems used with semiconductor processing chambers generally include a mass gas flow meter (MFC) as the primary flow regulation device. However, the accuracy of MFC's may be affected by a plurality of factors that contribute to an uncertainty of the actual gas flow. For example, the accuracy of the MFC will typically vary with changes in temperature, line pressure and volume. Deviation from the gas flow set point due to MFC inaccuracy may contribute to processing defects, poor emission control and inefficient waste of costly gases.

Although conventional pressure control systems have proven relatively reliable, field experience with the existing technology has increased the demand for more accurate measurement of flow. For example, poor control of gas flows used in backside substrate cooling applications may result in poor substrate temperate control, thereby causing poor film deposition or etching results, which cannot be tolerated in next generation circuit designs.

Moreover, conventional gas delivery systems generally have fixed conduits for routing gases from the gas sources into the processing chamber. Thus, only a predefined combination of process gases may be delivered to the processing chamber at any time. Such fixed gas delivery routing prevents process flexibility. For example, processing chambers having fixed gas delivery routes may not be able to accommodate new or revised process recipes that require a different combination of process gases. Additionally, a processing chamber having a fixed gas delivery route designed to deliver one combination of process gases to perform a first process may not be able to perform a second process that utilizes a different combination of gases, thereby preventing the processing chamber from being utilized for other processes and causing the FAB owner to invest in addition capitol equipment. Thus, it would be desirable to devise a gas delivery system having greater flexibility.

Therefore, there is a need for an improved method and apparatus for controlling the delivery of gases to a semiconductor processing system.

SUMMARY

A method and apparatus for delivering gases to a semiconductor processing system are provided. In one embodiment, an apparatus for delivering gases to a semiconductor processing system includes a plurality of gas input lines each having an inlet port and a plurality of gas output lines each having an outlet port. A plurality of connecting lines are provided that couple a respective pairs of gas input and gas output lines. Connecting valves are arranged to control flow through the respective connecting lines. A plurality of mass gas flow controllers are arranged to control flow into a respective inlet port.

In another embodiment, a method of controlling gas flow to a processing system that includes a processing chamber coupled to a facility exhaust through a foreline is provides that includes providing a manifold having at least a first, second third and fourth inlet that may be selectively coupled to at least one of a first, second third and fourth outlet, flowing one or more gases through the manifold to a vacuum environment by-passing the processing chamber prior to processing or to a calibration circuit, and flowing the one or more gases into the processing chamber during substrate processing.

In another embodiment, a method of controlling gas flow to a processing system that includes a processing chamber coupled to a facility exhaust through a foreline is provided. The method includes flowing a first gas from a first gas source into a manifold having at least a first outlet port, a second outlet port, a third outlet port and a fourth outlet port, flowing a second gas from a second gas source into the manifold, selecting an operational state of valves within the manifold to cause the first and second gases to exit through at least one of the second or third outlet ports while in a processing mode, flowing the first and second gases through the manifold and into the foreline by-passing the processing chamber until a predefine state of the gases within the manifold is obtained, directing the first and second gases exiting the manifold into the processing chamber after the predefine state has been obtained, and processing a substrate within the processing chamber.

BRIEF DESCRIPTION OF THE DRAWINGS

So that the manner in which the above recited features of the present invention may be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, wherever possible, to designate identical elements that are common to the figures. It is contemplated that features of one embodiment may be beneficially incorporated in other embodiments without further recitation.

DETAILED DESCRIPTION

Figure 1:
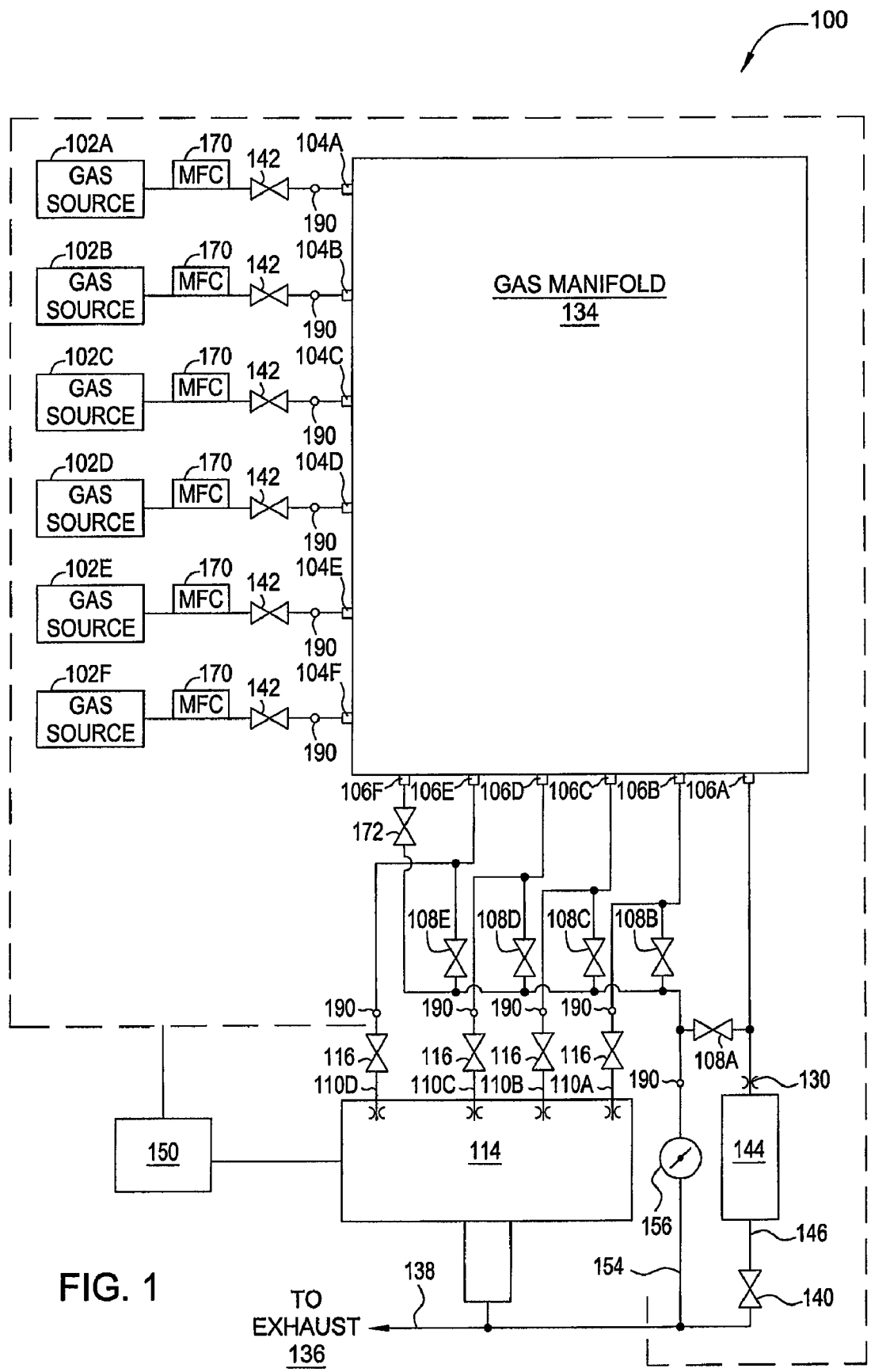
FIG. 1 is a simplified schematic of a semiconductor processing chamber coupled to one embodiment of a gas delivery system of the present invention.

FIG. 1 depicts a simplified schematic of a gas delivery system 100 utilized to supply gas to an exemplary semiconductor processing chamber 114. The processing chamber 114 may be configured to perform chemical vapor deposition (CVD), physical vapor deposition (PVD), etching process, ion implant, thermal processing, ashing, degassing, orientation or other vacuum processing technique. A controller 150 is coupled to the processing chamber 114 and gas delivery system 100 to control the operation thereof. The controller 150 generally includes a processor, support circuits and memory.

The gas delivery system 100 located outside of the processing chamber 114 includes a plurality of gas sources coupled to a gas manifold 134. The manifold 134 includes a plurality of valves (discussed further below) which enable any combination of gas sources to be coupled to the processing chamber 114. The manifold 134 also is configured to allow quick evacuation and flow verification of individual system components and conduits. Although the system 100 may be configured to interface with any number of gas sources, six gas sources 102A-F are shown in the embodiment depicted in FIG. 1.

Each gas source 102A-F is coupled to a respective manifold inlet port 104A-F. A shut-off valve 142 and a mass flow meter (MFC) 170 are disposed between each gas supply source 102A-F and respective manifold inlet port 104A-F to control the flow of gas from each source 102A-F entering the manifold 134. The manifold 134 includes a plurality of manifold outlet ports 106A-F that may be selectively coupled to any one of the gas supply sources 102A-F through the manifold inlet ports 104A-F. At least one of the outlet ports 106A-F may be coupled to a calibration circuit 144 and/or a purge line 154.

In the embodiment depicted in FIG. 1, six gas outlet ports 106A-F are provided. The first gas delivery outlet port 106A is coupled to the calibration circuit 144 that is configured to accurately measure gas flow. The calibration circuit 144 includes an orifice 130 sized to provide a chocked flow condition. In one embodiment, the orifice 130 is sized to provide a restriction that is substantially equal to that of the processing chamber 114. The orifice 130 creates flow conditions in the manifold 134 similar to conditions present when the gases are flowing into the processing chamber 114. The calibration circuit 144 may be utilized to perform flow verification of the MFC or other system components, while not requiring flow into the actual processing chamber 114. The orifice 130 may be determined by experimentation, empirical analysis or by other suitable method. In one embodiment, the orifice 130 may be determined by measuring the pressure downstream of the orifice 130 and adjusting the orifice size until a desired pressure is realized.

In one embodiment, the calibration circuit 144 includes a gas source, a diverter valve, an orifice, a regulating device and a sensing circuit. The regulating device is fluidly coupled between the gas source and an inlet of the diverter valve. The orifice is fluidly coupled to a first outlet of the diverter valve and has substantially the same flow resistance as a processing chamber. The sensing circuit is configured to receive the flow of gases passing through the orifice. In another embodiment, the calibration circuit 144 utilizes a calibrated volume for receiving the gas flow. From properties and/or attributes measured from the gas in the calibrated volume, the flow rate and/or pressure of the gas entering the sensing circuit may be verified. In another embodiment, the calibration circuit 144 utilizes a non-calibrated volume for receiving the gas flow. From changes in the properties and/or attributes measured over time of the gas in the non-calibrated volume, the flow rate and/or pressure of the gas entering the sensing circuit may be verified. In yet another embodiment, the calibration circuit 144 includes a vibrating member disposed in a calibrated volume. In other embodiments, the calibration circuit 144 may include a sensor configured to detect at least one of electrical or magnetic characteristics of gases disposed in the calibrated volume. In yet further embodiments, the calibration circuit 144 may include a tank supported by a cantilever. One suitable calibration circuit is described in U.S. Provisional Patent Application Ser. No. 60/822,345, filed Aug. 14, 2006, which is incorporated by reference in its entirety.

The flow leaving the calibration circuit 144 is coupled to the purge line 154 by a calibration circuit outlet line 146. An isolation valve 140 selectively isolates calibration circuit 144 from the purge line 154. The purge line 154 is coupled to a foreline 138 exiting the processing chamber 114 which runs to the facility exhaust 136.

The outlet ports 106B-E are coupled to one or more inlet ports of the processing chamber 114 to supply various process gases from the gas supply sources 102A-F. In the embodiment depicted in FIG. 1, outlet ports 106B-E are respectively coupled to inlet ports 110A-D of the processing chamber 114. A plurality of final valves 116 may be respectively coupled between the manifold outlet ports 106B-E and chamber inlet ports 110A-D to serve as an on/off flow control of the gas flow into the processing chamber 114.

The sixth port 106F is coupled to the purge line 154 through an isolation valve 172. When the isolation valve 172 is opened, the purge line 154 provides a fast evacuation path that facilitates efficient removal of the gases from the gas manifold 134 and into the facility exhaust 136. A throttle valve 156 may be utilized to control the flow of gases through the purge line 154 from the manifold 134. The fast evacuation path allows quick gas changes with minimal cross-talk between gases.

The fast evacuation path may also be selectively coupled to the manifold outlet ports 106A-E and the calibration circuit 144. In the embodiment depicted in FIG. 1, by-pass valves 108A-E are disposed between the manifold outlet ports 106A-E and the purge line 154. The by-pass valves 108A-E may be selectively operated to couple the outlet ports 106A-E to the foreline 138. For example, the by-pass valve 108A may be selectively operated to direct gas exiting the manifold outlet port 106A into the purge line 154, bypassing the calibration circuit 144. In another example, by-pass valves 108B-E may be selectively operated to direct gas exiting the manifold outlet ports 106B-E into the purge line 154, by-passing the processing chamber 114. Isolation valve 172 controls the flow from the sixth port 106F of the manifold 134 into the purge line 154.

Sensors 190 may also be provided at various locations in the gas delivery system 100 to provide a metric indicative of the gas flows and/or chemistries within the system 100. The metric provided by the sensors 190 may be utilized by the controller 150 to adjust the outputs of the MFC's 170 or other component of the gas delivery system 100 such that a desired composition, pressure, rate or volume of gases are provided to the chamber 114. The sensors 190 may be pressure sensor, chemistry sensor, flow rate sensor and the like.

Figure 2:
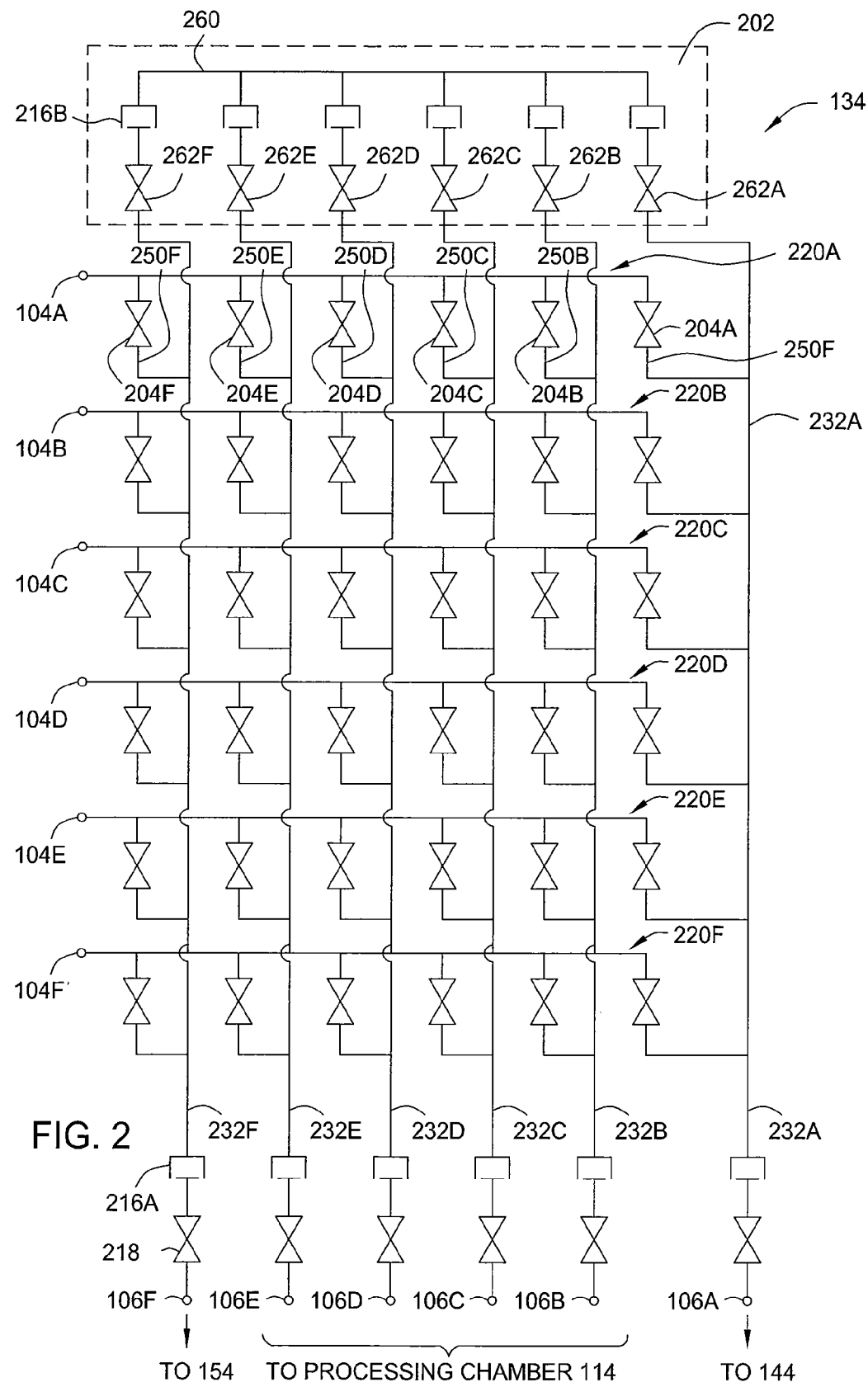
FIG. 2 is a schematic diagram of one embodiment of a mixing manifold of the gas delivery system of FIG. 1.

FIG. 2 is schematic diagram of one embodiment of the manifold 134 depicted in FIG. 1. Each manifold inlet port 104A-F is respectively coupled to an inlet gas delivery line 220A-F to facilitate transferring gases from the gas sources 102A-F into the manifold 134. Each manifold outlet port 106A-F is respectively coupled to an outlet gas delivery line 232A-F. Each of the gas delivery lines 232A-F may be selectively coupled to one or more of the inlet gas delivery lines 220A-F. Although the manifold 134 may be configured to interface with any number of inlet gas outlet gas delivery lines, six gas delivery lines 102A-F and six outlet gas delivery lines 232A-F are shown in the embodiment depicted in FIG. 2. Normally, the number of gas inlet delivery lines is commensurate with the number of gas sources.

The inlet gas delivery lines 220A includes a plurality of connecting lines 250A-F coupling the inlet gas delivery line 220A to a respective outlet gas delivery line 232A-F. Connecting valves 204A-F are disposed in communication with the connecting lines 250A-F and may be operated to fluidly couple the inlet gas delivery line 220A to one or more of the outlet gas delivery lines 232A-F through the inlet gas delivery line 220A, depending on the selected operational state of the valves 204A-F. The connecting valves 204A-F selectively couple the gas source 102A to selected outlet ports 106A-F, thereby controlling the routing of gas provided from source 102A through the manifold 134. For example, if connecting valve 204A is in an open operational state while connecting valves 204B-F remain closed, gas from the source 102A is routed through the outlet port 106A to the calibration circuit 144. In another example, if connecting valves 204B-C are in an open operational state while connecting valves 204A, D-F remain closed, gas from the source 102A is routed through the outlet ports 106B-C. Each of the other inlet gas delivery lines 220B-F are similarly configured with connecting lines 250A-F and valves 204A-F for coupling the inlet gas delivery lines 220B-F to the respective outlet gas delivery lines 232A-F. Reference numerals 250A-F and 204A-F associated with the inlet gas delivery lines 220B-F have been omitted to avoid cluttering of FIG. 2.

Figure 3:
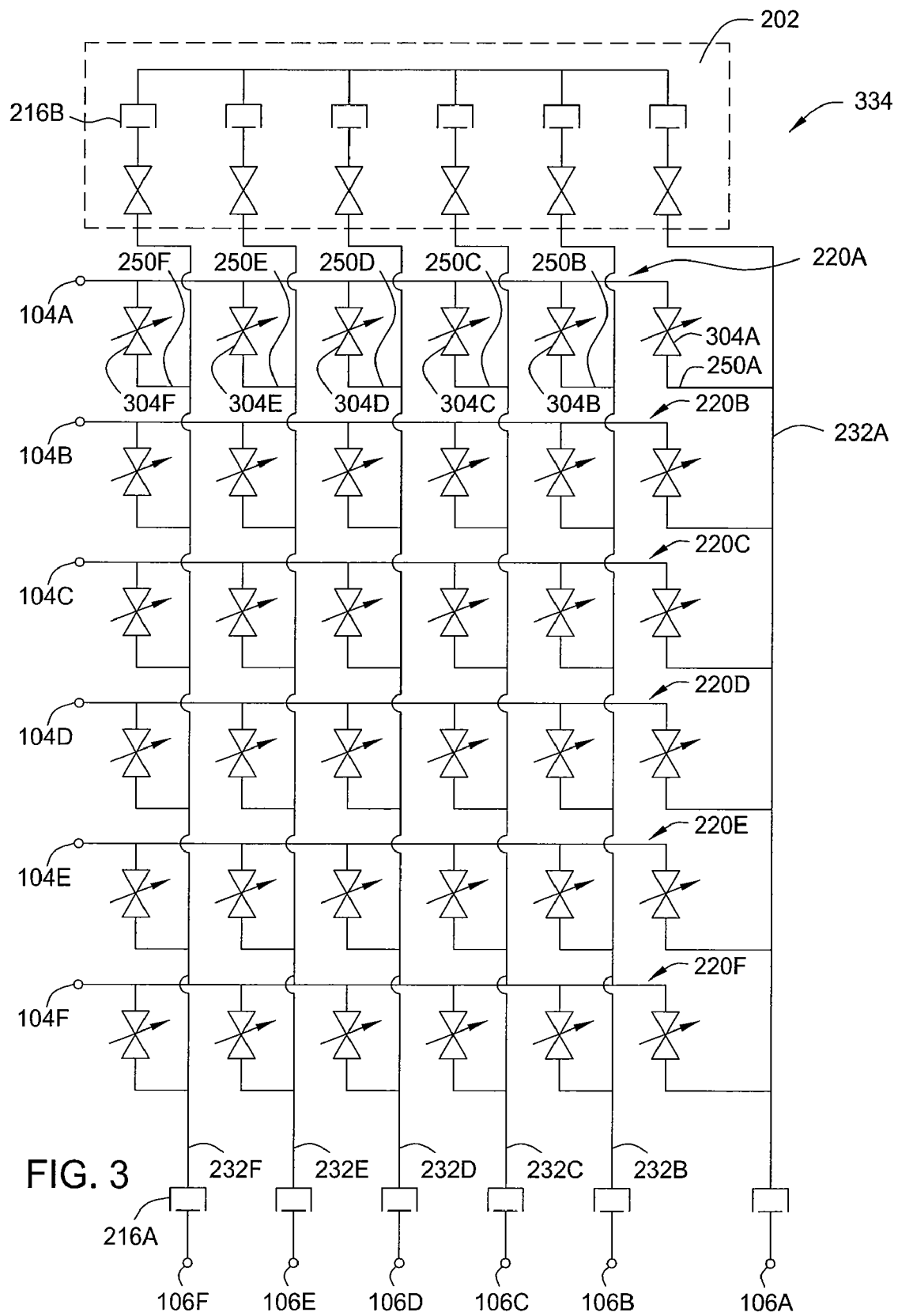
FIG. 3 is a schematic diagram of another embodiment of a mixing manifold.

FIG. 3 depicts an alternative embodiment of a gas manifold 334. The gas manifold 334 is substantially similar to the gas manifold 134 depicted in FIG. 2, except wherein the gas manifold 334 includes a plurality of variable connecting valves 304A-F coupling the gas inlet delivery line 220A to each gas outlet delivery line 232A-F. The variable connecting valves 304A-F may be adjusted to allow a proportion of the flow passing through the gas inlet delivery line 220A to enter the respective gas outlet delivery line. The variable connecting valve 304A-F may be a proportional valve, a pinch valve, a throttle valve, a mass flow controller, a needle valve or other flow control device suitable for regulating the flow between the inlet and outlet lines.

The operational state of the variable connecting valves 304A-F may be controlled to create a desired ratio of flow through the valve relative to flow by-passing the valve, such that the valves 304A-F operate as a flow ratio controller in the line 220A. The operational state of the variable connecting valves 304A-F may be adjusted by the controller 150 in response to a metric provided by the sensors 190 (not shown in FIG. 3). In this manner, for example, the ratio of gases provided into two (or more) gas outlet delivery lines 232A-F from the single gas inlet delivery line 220A may be adjusted in response to the metric provided by the sensors 190 so that a target chemistry composition, flow rate and/or pressure may be realized at the output 106A-F of the manifold 334. Each of the other inlet gas delivery lines 220B-F are similarly configured with connecting lines 250A-F and valves 304A-F for coupling the inlet gas delivery lines 220B-F to the respective outlet gas delivery lines 232A-F. Reference numerals 250A-F and 304A-F associated with the inlet gas delivery lines 220B-F have been omitted to avoid cluttering of FIG. 3.

Returning to FIG. 2, the manifold 134 may additionally include a bridging circuit 202. The bridging circuit 202 includes a bridging line 260 that may be selectively coupled to each of the output lines 232A-F by a respective selector valve 262A-F. Using the bridging circuit 202, any of the flow components, for example, one of the connecting valves 204, may be coupled to the calibration circuit 144. The bridging circuit 202 also allows the MFC 170 associated with a fluid source, for example source 102A, to be coupled to the calibration circuit 144 via a secondary route that incorporates the resistance of the connecting valve 204A. Moreover, the bridging circuit 202 allows each output line 232A-E to be coupled (through the output line 232F) to the purge line 154 from opposite ends, thereby reducing the time required to purge the manifold 134.

Figure 4:
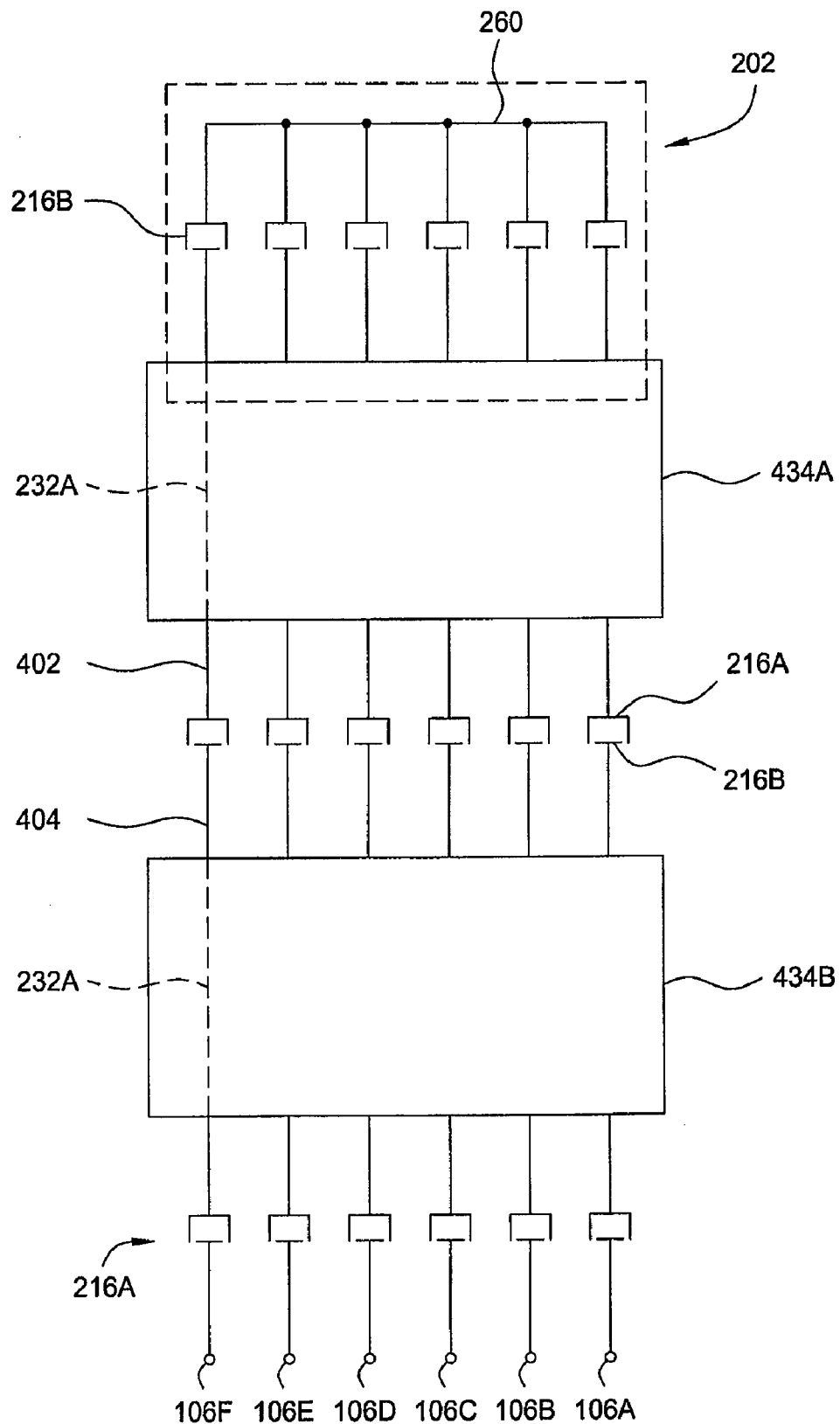
FIG. 4 is a schematic diagram of one embodiment of two mixing manifolds coupled together.

A plurality of disconnects may also be provided to allow coupling of multiple gas manifolds 134. In the embodiment depicted in FIG. 2, a first group of disconnects 216A are disposed adjacent each outlet port 106A-F while a second group of disconnects 216B are disposed in the bridging circuit 202 between the bridging line 260 and the valves 262A-F. For example, as shown in FIG. 4, the second group of disconnects 216B allows the bridging line 260 of a first manifold 434A to be removed and a first end 402 of the gas outlet delivery line 232A of the first manifold 434A to be coupled to a second end 404 of the outlet line 232A of a second manifold 434B using the mating portions of disconnects 216A, 216B of each manifold 434A, 434B. The other outlet lines 232B-F (not shown in FIG. 3) are similarly coupled. It is contemplated that any number of manifolds may be coupled together in this manner.

Returning to FIG. 2, one or more sensors 190 as described above may be interfaced with any of the lines 220A-F, 232A-F, 260, 154 to provide a metric indicative of the gas flows and/or chemistries within the system 100. The metric provided by the sensors 190 may be utilized by the controller 150 to adjust the operational state of the MFC's 170, valves 262A-F, 204A-F, 304A-F or other component of the gas delivery system 100 such that a desired composition, pressure, rate or volume of gases are provided to the chamber 114. The metric may also be utilized to monitor the composition of gases within various portions of the gas delivery system 100 so that the status of purging, chemical mixing, gas changes and the like may be detected in real time, thereby enhancing system response time and minimizing waste of expensive process gases.

Figure 5:
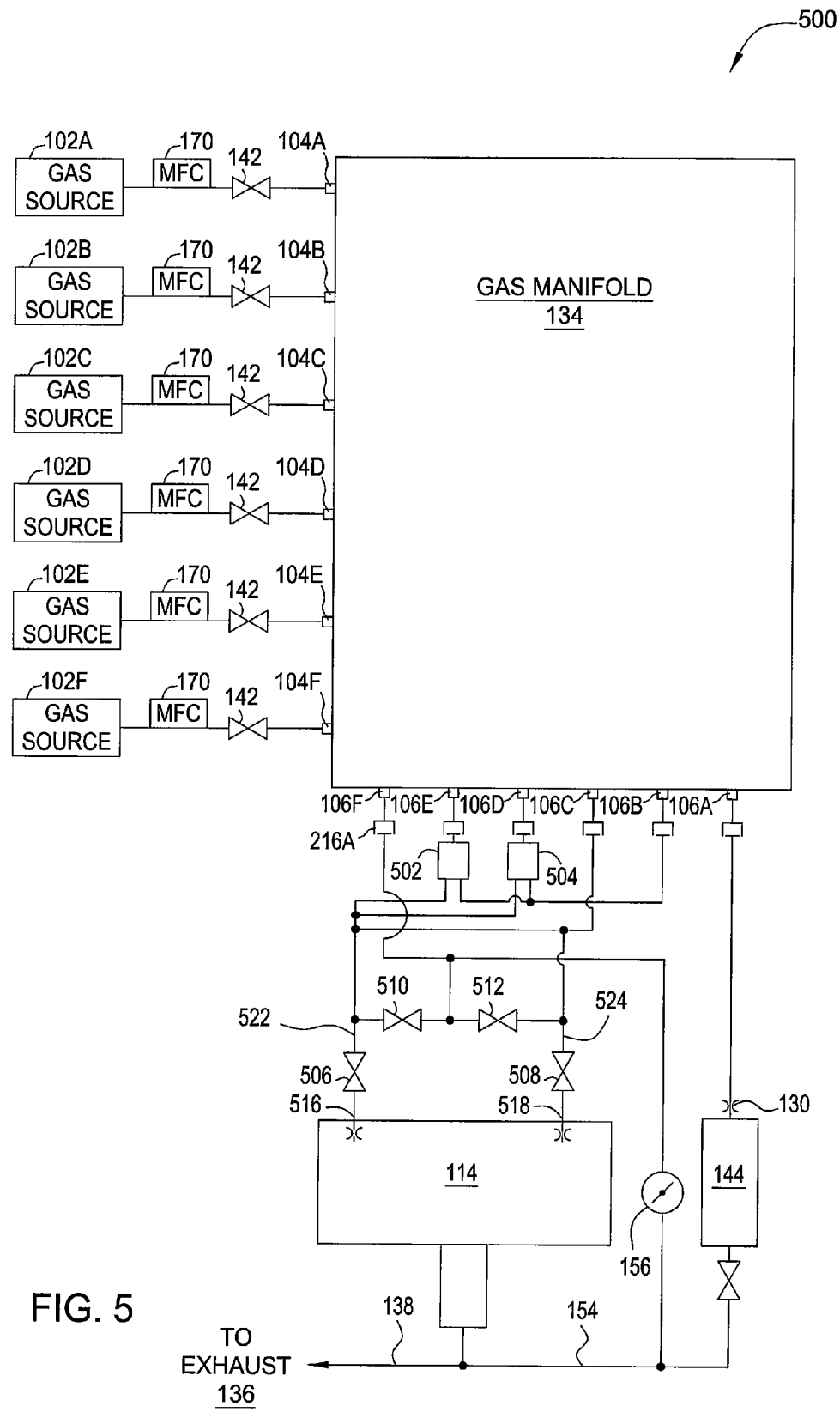
FIG. 5 is a simplified schematic of a semiconductor processing chamber coupled to another embodiment of a gas delivery system.

FIG. 5 depicts another embodiment of a gas delivery system 500 utilized to supply gas to a processing chamber 114. The gas delivery system 500 includes a manifold 134 coupled to gas sources 102A-F, purge line 154 and a calibration circuit 144 as described above. Outlet ports 106B-E of the manifold 134 are selectively coupled to inlet port 516, 518 of the processing chamber 114 to facilitate transferring gases to the processing chamber 114. In the embodiment depicted in FIG.

5, two separate gas inlet ports 516, 518 are utilized to deliver gases supplied from the manifold 134 to the processing chamber 114. In one embodiment, the inlet port 516 provides gases to a center of the processing chamber 114, while inlet port 518 is disposed outward of the inlet port 516 and provides gases to the outer regions of the processing chamber (e.g., to the perimeter of the substrate disposed within the chamber). For example, the inlet port 516 may provide gases to center regions of a showerhead while the inlet port 518 may provide gases to outer regions of the showerhead. In another example, the inlet port 516 may be disposed in a ceiling of a processing chamber and provide gases downwardly to a substrate while the inlet port 518 may be disposed in a sidewall of the processing chamber provide gases to outer regions of the substrate. In yet another embodiment, the gases may be provided separately through inlet ports 516, 518 such that mixing of the gases only occurs once within the interior volume of the processing chamber 114.

Flow ratio controllers (FRC) 502, 504 are coupled to each outlet ports 106D-E. The FRC's 502, 504 split the flows exiting each outlet ports 106D-E so that a predetermined flow ratio is provided between each inlet port 516, 518 of the processing chamber 114 The FRC's 502, 504 may have a fixed output ratio, or may have an adjustable output ratio. The output of the FRC's 502, 504 and the manifold output ports 106B-C are respectively combined into common delivery lines 522, 524. Flow through each delivery line 522, 524 is controlled by a final valve 508, 506 positioned just upstream of the inlet ports 516, 518 of the processing chamber 114.

By-pass valves 510, 512 are coupled to each delivery line 522, 524. The by-pass valves 510, 512 may be opened to couple each delivery line 522, 524 to the purge line 154.

The gas delivery systems described provides many advantages over conventional systems. In addition to the system's modularity, the gas delivery system may be operated to provide pre-flow path, a fast evacuation path, controlled chemical mixing, more efficient use of chemistries, sequenced reduced fill and evacuation times, closed loop control for fine tuning of chemistry delivery and flow verification.

Pre-Flow Path

In one mode of operation, a pre-flow path is defined through the gas delivery system 100 and provides a connection from the chemistry source (e.g., sources 102A-F) through one or more valves to a vacuum environment that is separate from the processing chamber 114 (e.g., the foreline 138 through the purge line 154). Before gases are requested in the processing chamber 114, the gases may be supplied to the appropriate lines of the manifold 134 of the gas delivery system 100 in a condition that substantially matches the condition of the gas as if it was flowing into the processing chamber 114. This allows the gases within the manifold 134 to rapidly reach a steady state condition that is substantially maintained one the gases are diverted into the processing chamber 114. Since the pre-flow path allows the gases within the gas delivery system 100 to stabilize in a "process condition" before being delivered into the processing chamber 114, there is little or no change in the flow conditions within the delivery system 100 once flow to the chamber is commenced, unlike conventional gas delivery systems which typically experience a pressure drop and diminished flow rates. Thus, the uniformity of gas delivery in the processing chamber can be quickly established because the pre-flow path provides substantially the same resistance and flow conditions as if the gases were flowing into the processing chamber. The throttle valve 156 may also be utilized to match the conditions in the pre-flow gas path to that of the processing chamber 114.

Additionally, any flow dividing devices, such as the flow ratio controllers 502, 504 or valves 304A-F, may have their outputs routed into the pre-flow path prior to processing so that the outputs of the dividing devices can be stabilized before flow is delivered to the processing chamber. In one embodiment, the pre-flow path is defined through the purge line 154 and the by-pass lines through the manifold outlets 106A-B through the by-pass valves 108A-F and into the purged line 154.

Fast Evacuation Path

In another mode of operation, a fast evacuation path is defined in the gas delivery system 100 and provides a connection from the manifold 134 to the foreline 138 through the purge line 154. The fast evacuation path provides a connection from the chemical delivery sources through the processing chamber delivery path through one or more valves to a vacuum environment that is separate from the processing chamber 114 (e.g., the foreline 138 through the purge line 154). The fast evacuation path is coupled to each chamber connection such that there is at least one connection between any two flow restrictions, such as the flow ratio controllers 502, 504, valves 304A-F or other flow restriction. When it is required that the chemistry within the processing chamber 114 should change, the isolation valve 172 and by-pass valves 108A-E to the vacuum environment will be opened, removing the excess process chemicals from the chemical delivery path.

As discussed above, the operational state of the various valves within the manifold 134 may be sequenced such that the purge time of chemicals being removed from the gas delivery system 100 through the fast evacuation path is minimized. Additionally, the operational state of the valves 204A-F may also be sequenced so that as certain regions the manifold 134 are emptied of the chemicals utilized in the previous process, the emptied regions may be then filled with the new chemistry, such that the gases within the manifold 134 are replaced in the most efficient manner. Moreover, as certain portions of the manifold 134 are evacuated more quickly relative to other portions of the manifold, sequencing the valves 204A-F may be made in a manner that allows the new chemicals replacing the old chemicals to reach equilibrium (e.g., processing flow conditions) in the shortest time possible.

In one embodiment, higher pressure, volume and/or flow of replacement gases from the sources 102A-F may be provided to one or more regions of the manifold 134 to expedite changeover. As the flow of replacement gases exiting the manifold 134 approaches the desired chemical mix, pressure and/or volume, the flow of chemicals into the chemical delivery system 100 may be reduced to the desired levels in a manner that maintains a desired flow out of the manifold 134. In cases where the chemical delivery system 100 will be filled with chemicals from earlier processes, flows into the chemical delivery system may be altered (i.e., reduced or increased, depending on the desired effect) so that the desired flow into the processing chamber will reach the desired values as quickly as possible. As the chemical flow out of the manifold approaches the desired chemical mix and flow rate, the flow of chemicals into the manifold 134 will be adjusted toward the desired flow rates in a manner that maintains the desired flow into the processing chamber 114.

In another embodiment, chemistry change may be expedited by sequencing the valves 204A-F such that only gas delivery lines 232A-F containing gas which have not yet been replaced maintain coupled to the purge line 154. Once replacement gas is detected exiting the manifold 134 from one of the gas delivery lines 232A-F or at another predefined location, that gas delivery line 232A-F supplying the replacement gas is disconnected from the purge line 154 so that the replacement gas is not wasted. In one embodiment, the replacement gas may be diverted from the purge line 154 into the processing chamber 114 until the change over is completed. In this manner, the pumping capacity of the purge line 154 is dedicated to only those lines requiring gas removal so that change over of processing gases may be made in an efficient manner. It is also contemplated that the fastest evacuation path may include routing gas flows through the bridging circuit 202 to the purge line 154 for at least a portion of the change over time.

Chemical Mixing and Closed Loop Control

In another mode of operation, the gas delivery system 100 may be utilized to enhance chemical mixing. In one embodiment, chemical mixing may occur within the manifold 134 using the valves 304A-F or by coupling two or more sources 102A-F to a single gas outlet delivery line 232A-F.

In another embodiment, the sensors 190 may be utilized to provide closed loop control of the chemical mixing within the gas delivery system. By monitoring the chemistries entering the chamber 114, exiting the manifold 134 and/or at any other point within the gas delivery system 100 using the sensors 190, real time adjustment of chemistry parameters, such as desired composition (e.g., gas mix), rate and/or pressure, may be realized. For example, if sensors detect an improper flow ratio of chemistry from sources 102A-B exiting the manifold at port 106C, the operational state of the valves 304C coupling inlet delivery lines 220A-220B to outlet delivery line 232C may be adjusted to bring the chemistry flows to a desired target ratio. The same process may be performed using the other valves or flow ratio controllers. Information from the sensors 190 may also be utilized to adjust the MFC settings, flow rates and/or pressures of the gases provided from the sources 102A-F.

Conservation of Gases/Chemistries

In another mode of operation, the gas delivery system 100 enhances efficient use of chemistries. For example, the sequence of in which the operational states of the valves 204A-F, 172, 108A-E, 262A-F are changed may be arranged in a manner that removes gases from the manifold 134 most effectively and with minimal mixing of gases, thereby allowing faster response time and reduced processing time. Thus, during gas changes, the rate that gases are drawn through the delivery path (e.g., through outlet lines 232A-F) and into the purge line 154 may be adjusted using the throttle valve 156 to advance the gases quickly through the manifold 134. Moreover, while the purge line 154 is drawing gases through the manifold 134, lines which are contain gases ready for the next processing sequence, such as newly introduced gases, purge gas and/or the last remnants of gases previously contained in the manifold, may be diverted from the purge line 154 and flowed into the processing chamber 114. This allows the remaining lines coupled to the purge line 154 to be evacuated more rapidly. In one embodiment, a metric provided by the sensors 190 may be utilized to indicate when a diversion from the purge line 154 to the chamber 114 should occur, for example, by a change or stabilization in the composition of the gases, flow rate and or pressure of gases within the line.

Flow Verification

In another mode of operation, the gas delivery system 100 may be utilized to verify the flow rates of any of the components within the system using the calibration circuit 144. For example, the valves of the system 100 may provide flow from any one of the inlet ports to the calibration circuit 144. In another example, flows divided by valves of the system may be verified for flow rates along each branch of the divided flow.

Figure 6:
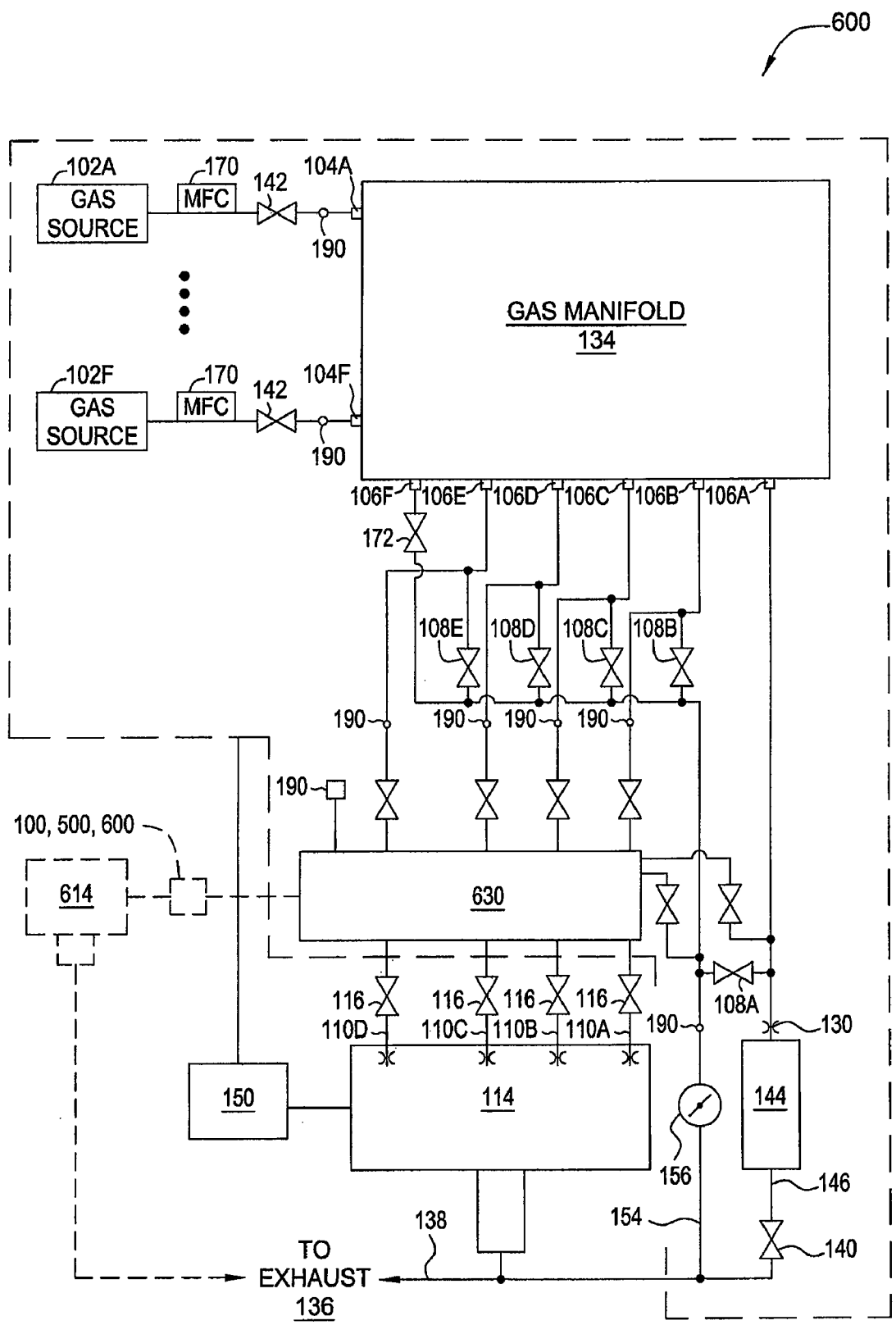
FIG. 6 is a simplified schematic of a semiconductor processing chamber coupled to another embodiment of a gas delivery system.

FIG. 6 is a simplified schematic of a semiconductor processing chamber 114 coupled to another embodiment of a gas delivery system 600. The gas delivery system 600 is configured substantially similar to the gas delivery systems describe above, except wherein the system 600 includes a storage tank 630 coupled to at least one of the output ports 106A-F of the system's manifold 134. The storage tank 630 may be coupled to the at least one or more of the processing chamber 114, a second processing chamber 614 (shown in phantom), a gas delivery system 100 (500 or 600) of the second processing chamber 614, the calibration circuit 144 or the facility exhaust 136. A sensor 190 may be provided to provide a metric indicative of the gas within the tank 630. In one embodiment, the metric may be indicative of the gas pressure, gas composition (e.g., chemistry), temperature or other characteristic.

In one embodiment, each output port 106A-F may be individually coupled to the tank 630. In another embodiment, the tank 630 may be segmented (as shown in phantom) so that each 106A-F may be retained in the tank 630 without mixing, then individually coupled to the processing chamber 114. Alternatively, separate tanks 630 may be use. It is also contemplated that the inlet of the tank 630 may be utilized to deliver gases to the processing chamber 114.

Thus, gas delivery systems having fast evacuation paths that advantageously enable processing gases supplying from the gas delivery systems into a processing system with stable gas flow and minimum fluctuation. The fast evacuation paths are utilized to provide an alternative manner to verify and/or calibrate gas flows from the gas delivery systems, thereby providing good control of the gas flow supplying to the processing system.

While the foregoing is directed to embodiments of the present invention, other and further embodiments of the invention may be devised without departing from the basic scope thereof, and the scope thereof is determined by the claims that follow.

What is claimed is:

1. A method of controlling gas flow to a processing system that includes a processing chamber coupled to a facility exhaust through a foreline, comprising:

flowing a first gas from a first gas source into a manifold having at least a first outlet port, a second outlet port, a third outlet port and a fourth outlet port, wherein the first outlet port is coupled to the foreline through an evacuation path comprising an isolation valve and a purge line, each of the second and third outlet port is connected to the processing chamber through a respective final valve, each of the second and third outlet port is connected to a pre-flow path through a respective by-pass valve, and the pre-flow path comprises:

a throttle valve upstream to the purge line; and the purge line upstream to the foreline;

flowing a second gas from a second gas source into the manifold;

selecting an operational state of valves within the manifold to cause the first and second gases to exit through at least one of the second or third outlet ports while in a processing mode;

flowing the first and second gases through at least one of the second or third outlet ports of the manifold into the foreline by-passing the processing chamber through the pre-flow path until a predefine state of the gases within the manifold is obtained, wherein the predefined state is obtained by utilizing the throttle valve to match conditions in the pre-flow path to conditions of the processing chamber;

directing the first and second gases exiting the manifold through at least one of the second or third outlet ports into the processing chamber after the predefine state has been obtained; and processing a substrate within the processing chamber.

2. The method of claim 1 further comprising:

flowing the first and second gases through the manifold into the foreline by-passing the processing chamber after substrate processing is complete.

3. The method of claim 2 further comprising:

replacing at least one of the first and second gases in the manifold with a third gas provided to the manifold from a third gas source.

4. The method of claim 3 further comprising:

preventing the third gas exiting the manifold from entering the foreline ; and continuing to draw at least one of the first or second gas into the foreline while the third gas is exiting the manifold.

5. The method of claim 4, wherein preventing the third gas from entering the foreline comprises stopping the flow of the third gas or flowing the third gas into the processing chamber.

6. The method of claim 4, wherein preventing the third gas from entering the foreline comprises:

decoupling the outlet ports through which the third gas is exiting the manifold from the foreline.

7. The method of claim 1 further comprising:

adjusting the operational state of at least one valve in the manifold to obtain a ratio of flows from one gas source through at least two outlet ports.

8. The method of claim 7, wherein adjusting the operational state of the at least one valve in the manifold further comprises:

sensing a metric of the gas exiting the manifold; and adjusting the operational state of the at least one valve in the manifold to change the ratio of flows through the at least two outlet ports.

9. The method of claim 1 further comprising:

sensing a metric of the gas exiting the manifold; and adjusting one of the flow of at least one gas entering the manifold, at least one flow ratio controller, a composition of the gas entering the chamber, or a pressure of the gas entering the chamber in response to the sensed metric.

10. The method of claim 1 further comprising:

selecting an operational state of the valves within the manifold to cause at least one of the first and second gases to exit through the fourth outlet port and into a calibration circuit.

11. The method of claim 10, further comprising providing a chocked flow condition in the calibration circuit using an orifice, wherein the orifice is sized to provide a restriction substantially equal to that of the processing chamber.

12. The method of claim 1, further comprising evacuating the manifold by opening the isolation valve to remove the first and second gases from the manifold through the first outlet port and the evacuation path.

13. The method of claim 12, wherein evacuating the manifold further comprises utilizing the throttle valve to control the flow of gases from the manifold to the purge line.

14. The method of 13, wherein evacuating the manifold further comprises opening the by-pass valves coupled to the second and third outlet port to direct gas exiting the second and third outlet ports into the purge line by-passing the processing chamber.

15. A method of controlling gas flow to a processing system that includes a processing chamber coupled to a facility exhaust through a foreline, comprising:

providing a manifold having at least a first, second, third and fourth inlet that may be selectively coupled to at least one of a first, second, third and fourth outlet port, wherein the first outlet port is coupled to the foreline through an evacuation path comprising an isolation valve and a purge line, each of the second and third outlet port is connected to the processing chamber through a respective final valve, each of the second and third outlet port is connected to a pre-flow path through a respective by-pass valve, and the pre-flow path comprises:

a throttle valve upstream to the purge line; and the purge line upstream to the foreline;

flowing one or more gases through the manifold to the pre-flow path by-passing the processing chamber prior to processing or to the calibration circuit, wherein the throttle valve in the pre-flow path is adjusted to match conditions in the pre-flow path to conditions of the processing chamber; and flowing the one or more gases into the processing chamber during substrate processing.

16. The method of claim 15, wherein flowing one or more gases through the manifold to the vacuum environment further comprises:

waiting until the flow of gases meets a predefined criteria prior to diverting the flow to the processing chamber.

17. The method of claim 15, wherein predefined criteria is at least one of flow rate, pressure or gas composition.

18. A method of controlling gas flow to a processing system that includes a processing chamber, comprising:

flowing a first gas from a first gas source into a manifold having at least a first outlet port, a second outlet port, a third outlet port and a fourth outlet port, wherein at least the second and third outlet ports are coupled to a processing chamber, the processing chamber is coupled to an exhaust through a foreline, the first outlet port is coupled to the foreline through an evacuation path comprising an isolation valve and a purge line, each of the second and third outlet port is connected to a pre-flow path through a respective by-pass valve, and the pre-flow path comprises:

a throttle valve upstream to the purge line; and the purge line upstream to the foreline;

selecting an operational state of valves within the manifold to cause the first gas to flow simultaneously through at least second and third outlet ports; and flowing the first gas through at least one of the second or third outlet ports of the manifold into the foreline by-passing the processing chamber through the pre-flow path until a predefine state of the gas within the manifold is obtained, wherein the predefined state is obtained by utilizing the throttle valve to match conditions in the pre-flow path to conditions of the processing chamber.

19. The method of claim 18 further comprising:

sensing a metric indicative of the flow of the first gas; and controlling the ratio of first gas flow between the first and second outlet ports in response to a sensed metric.

20. The method of claim 19, wherein sensing further comprises:

sensing at least one of chemistry, pressure or rate of each flow division of the first gas.

21. The method of claim 18 further comprising:

validating, using the sensed metric, that the flow division meets a predefined criteria.

\* \* \* \* \*